(12) United States Patent
Kuan

(10) Patent No.: US 8,076,913 B2
(45) Date of Patent: Dec. 13, 2011

(54) VOLTAGE CONVERTERS AND VOLTAGE GENERATING METHODS FOR GENERATING OUTPUT VOLTAGE SIGNALS ACCORDING TO A PULSE WIDTH MODULATION SIGNAL

(75) Inventor: Chien Wei Kuan, Hsinchu (TW)

(73) Assignee: Mediatek Inc., Hsin-Chu (TW)

( * ) Notice: Subject to any disclaimer, the term of this patent is extended or adjusted under 35 U.S.C. 154(b) by 302 days.

(21) Appl. No.: 12/340,894

(22) Filed: Dec. 22, 2008

(65) Prior Publication Data

US 2010/0156491 A1    Jun. 24, 2010

(51) Int. Cl.
*H02J 3/12* (2006.01)
*G05F 1/00* (2006.01)

(52) U.S. Cl. .................................. 323/243; 323/285

(58) Field of Classification Search .................. 323/263, 323/282, 290, 242, 243, 284–288
See application file for complete search history.

(56) References Cited

U.S. PATENT DOCUMENTS

| 7,019,501 | B2* | 3/2006 | Dogome et al. | 323/282 |
|---|---|---|---|---|
| 7,057,380 | B2* | 6/2006 | Kuo et al. | 323/284 |
| 7,180,274 | B2* | 2/2007 | Chen et al. | 323/222 |
| 7,701,188 | B2* | 4/2010 | Kojima | 323/284 |
| 7,777,468 | B2* | 8/2010 | Okuda et al. | 323/282 |
| 2005/0212502 | A1* | 9/2005 | Casey et al. | 323/284 |
| 2006/0113980 | A1* | 6/2006 | Yoshida | 323/282 |
| 2007/0013356 | A1* | 1/2007 | Qiu et al. | 323/288 |
| 2007/0069703 | A1* | 3/2007 | Kokubun et al. | 323/282 |
| 2007/0296389 | A1* | 12/2007 | Chen et al. | 323/290 |
| 2008/0203981 | A1* | 8/2008 | Itoh et al. | 323/263 |
| 2009/0058383 | A1* | 3/2009 | Ryoo | 323/282 |
| 2009/0201000 | A1* | 8/2009 | Kojima et al. | 323/282 |
| 2010/0079127 | A1* | 4/2010 | Grant | 323/285 |

* cited by examiner

*Primary Examiner* — Jeffrey Sterrett
*Assistant Examiner* — Gary Nash
(74) *Attorney, Agent, or Firm* — Thomas|Kayden

(57) ABSTRACT

A voltage converter is provided. The voltage converter generates an output voltage signal and comprises a controller, a wave generator, a comparator, and a voltage converting unit. The controller generates a control voltage signal according to the output voltage signal and a first reference voltage. The wave generator generates a saw-wave signal and modifies at least one of an upper limit and a lower limit of a waveform of the saw-wave signal according to the output voltage signal. The comparator generates a pulse width modulation (PWM) signal according to the control voltage signal and the saw-wave signal. The voltage converting unit generates the output voltage signal according to the PWM signal.

14 Claims, 7 Drawing Sheets

VOLTAGE CONVERTERS AND VOLTAGE GENERATING METHODS FOR GENERATING OUTPUT VOLTAGE SIGNALS ACCORDING TO A PULSE WIDTH MODULATION SIGNAL

BACKGROUND OF THE INVENTION

1. Field of the Invention

The invention relates to a voltage generating method, and more particularly to a voltage converter.

2. Description of the Related Art

FIG. 1 shows a conventional buck converter. Referring to FIG. 1, the buck converter 1 generates a direct-current (DC) output voltage signal Vout and comprises an error amplifier 10, a compensating unit 11, a comparator 12, a driver 13, a P-type metal oxide semiconductor (PMOS) transistor 14, an NMOS transistor 15, an inductor 16, and a capacitor 17. The compensating unit 11 comprises a resistor 110 and a capacitor 111 coupled together in series between a node N10 and a signal ground GND. The PMOS transistor 14 and the NMOS transistor 15 are coupled in series between a supply voltage source VDD and the signal ground GND.

The error amplifier 10 receives the output voltage signal Vout and a reference voltage Vref and generates a control voltage signal Vc according to the difference between the output voltage signal Vout and the reference voltage Vref. The compensating unit 11 is charged or discharged by the control voltage signal Vc. The comparator 12 receives the control voltage signal Vc and a saw-wave signal Vramp and generates a pulse width modulation (PWM) signal Vpwm according to the difference between the control voltage signal Vc and the saw-wave signal Vramp. Referring to FIG. 2, an upper limit and a lower limit of a waveform of the saw-wave signal Vramp, which is applied to the conventional buck converter 1, are fixed, and the waveform of the saw-wave signal Vramp has only one slope within every period. It is assumed that the control voltage signal Vc is at a level LV10 in a stable state. According to the difference between the control voltage signal Vc at the level LV10 and the saw-wave signal Vramp, the PWM signal Vpwm generated thereby has a duty cycle D10. The driver 13 respectively switches ON/OFF states of the PMOS and NMOS transistors 14 and 15 according to the PWM signal Vpwm with the duty cycle D10. Accordingly, a square signal Vsqu is generated at a node N11. The square signal Vsqu is filtered by the inductor 16 and the capacitor 17, so that the DC output voltage signal Vout is generated at an output node Nout.

When an external load draws out a large current from the output node Nout, the level of the output signal Vout is pulled down due to the large current. At this time, referring to FIG. 2, the control voltage signal Vc is thus changed to a higher level LV11 according to the difference between the lowered output voltage signal Vout and the reference voltage Vref, so that the PWM signal Vpwm can have an increased duty cycle D11, which is larger than D10, for advantageous power transmission. In order to shorten the response time, the capacitor 111 generally has small capacitance. However, the capacitor 111 with small capacitance causes the control voltage signal Vc to have low stability, thus, resulting in an inaccurate output signal Vout being output.

BRIEF SUMMARY OF THE INVENTION

An exemplary embodiment of a voltage converter generating an output voltage signal is provided, and comprises a controller, a wave generator, a comparator, and a voltage converting unit. The controller is arranged to generate a control voltage signal according to the output voltage signal and a first reference voltage. The wave generator is arranged to generate a saw-wave signal and modifies at least one of an upper limit and a lower limit a waveform of the saw-wave signal according to the output voltage signal. The comparator is arranged to generate a pulse width modulation (PWM) signal according to the control voltage signal and the saw-wave signal. The voltage converting unit is arranged to generate the output voltage signal according to the PWM signal.

Another exemplary embodiment of a voltage converter generating an output voltage signal is provided and comprises a controller, a wave generator, a comparator, and a voltage converting unit. The controller is arranged to generate a control voltage signal according to the output voltage signal and a first reference voltage. The wave generator is arranged to generate a saw-wave signal, and a waveform of the saw-wave signal has at least two different slopes. The comparator is arranged to generate a pulse width modulation (PWM) signal according to the control voltage signal and the saw-wave signal. The voltage converting unit is arranged to generate the output voltage signal according to the PWM signal.

An exemplary embodiment of a voltage generating method generating an output voltage is provided. The voltage generating method comprises the steps of: providing a saw-wave signal; comparing a control voltage signal with the saw-wave signal to generate a compared result; generating a pulse width modulation (PWM) signal according to the compared result; generating the output voltage signal according to the PWM signal; detecting a variation of the output voltage signal; and modifying at least one of an upper limit and a lower limit of a waveform of the saw-wave signal according to the variation of the output voltage signal.

Another exemplary embodiment of a voltage generating method generating an output voltage is provided. The voltage generating method comprises steps of: providing a saw-wave signal with a waveform having at least two different slopes; comparing a control voltage signal with the saw-wave signal to generate a compared result; generating a pulse width modulation (PWM) signal according to the compared result; and generating the output voltage signal according to the PWM signal.

Another exemplary embodiment of a voltage converter for generating an output voltage signal is provided and comprises a controller, a wave generator, a comparator, and a voltage converting unit. The controller generates a control voltage signal according to the output voltage signal and a first reference voltage. The wave generator generates a saw-wave signal. The comparator generates a pulse width modulation (PWM) signal according to the control voltage signal and the saw-wave signal. The voltage converting unit generates the output voltage signal according to the PWM signal. When loading of the voltage converter becomes heavy, a duty cycle of the PWM signal is accordingly increased.

Another exemplary embodiment of a voltage generating method for generating an output voltage by a voltage converter is provided and comprises: providing a saw-wave signal; comparing a control voltage signal with the saw-wave signal to generate a compared result; generating a pulse width modulation (PWM) signal according to the compared result; and generating the output voltage signal according to the PWM signal. A duty cycle of the generated PWM signal depends on loading of the voltage converter.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
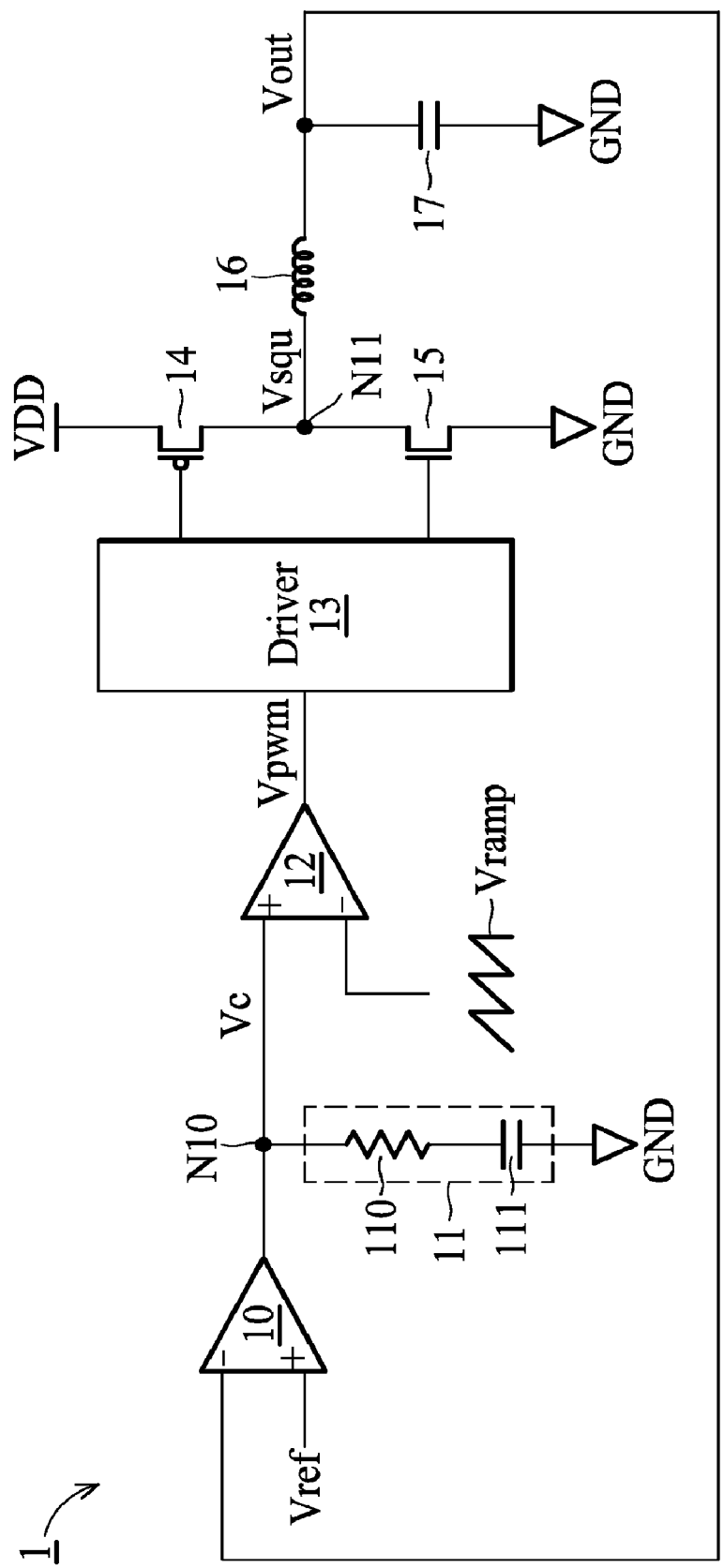
FIG. 1 shows a conventional buck converter.
Figure 2:
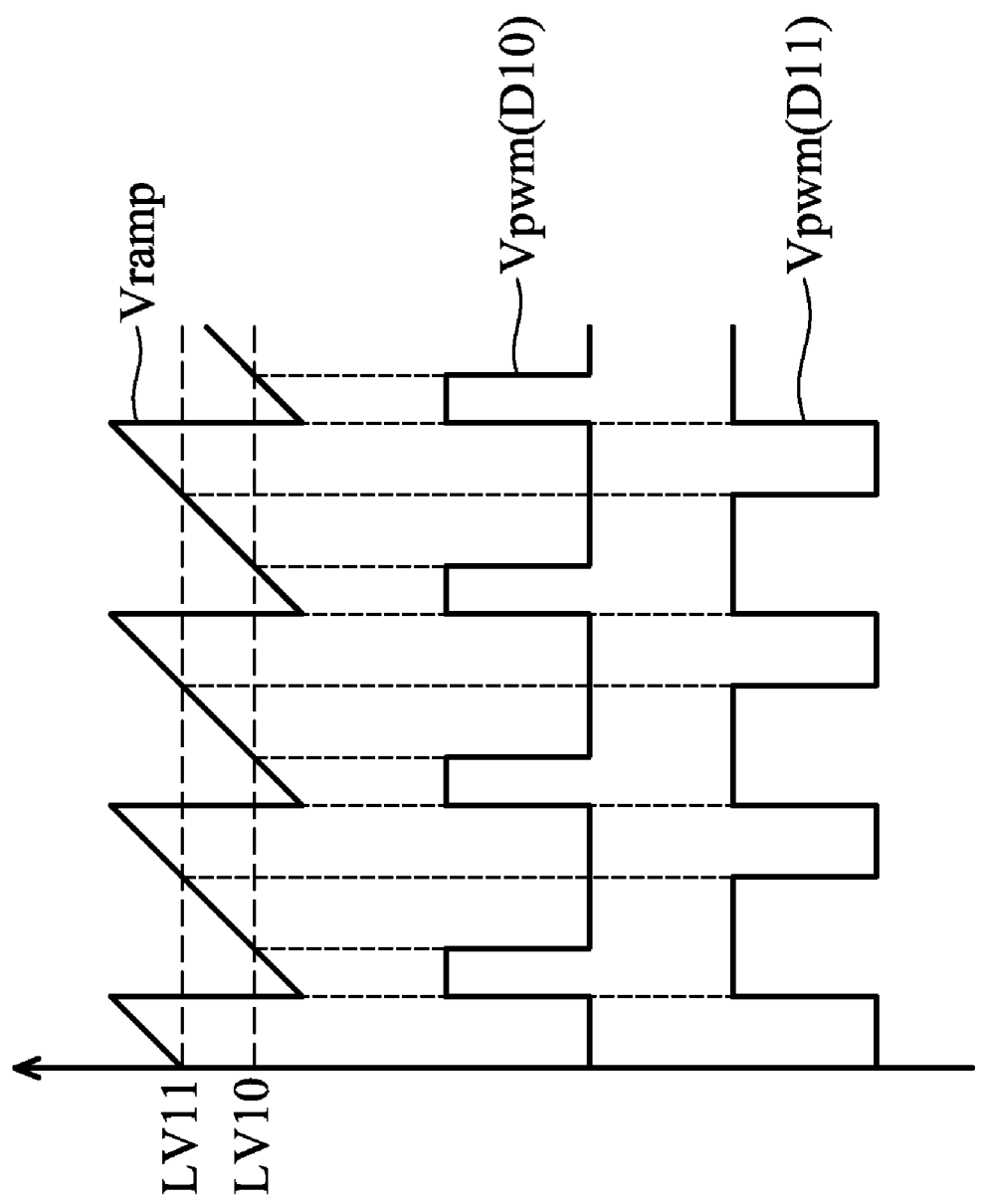
FIG. 2 shows signal waveforms of the buck converter in FIG. 1.
Figure 3:
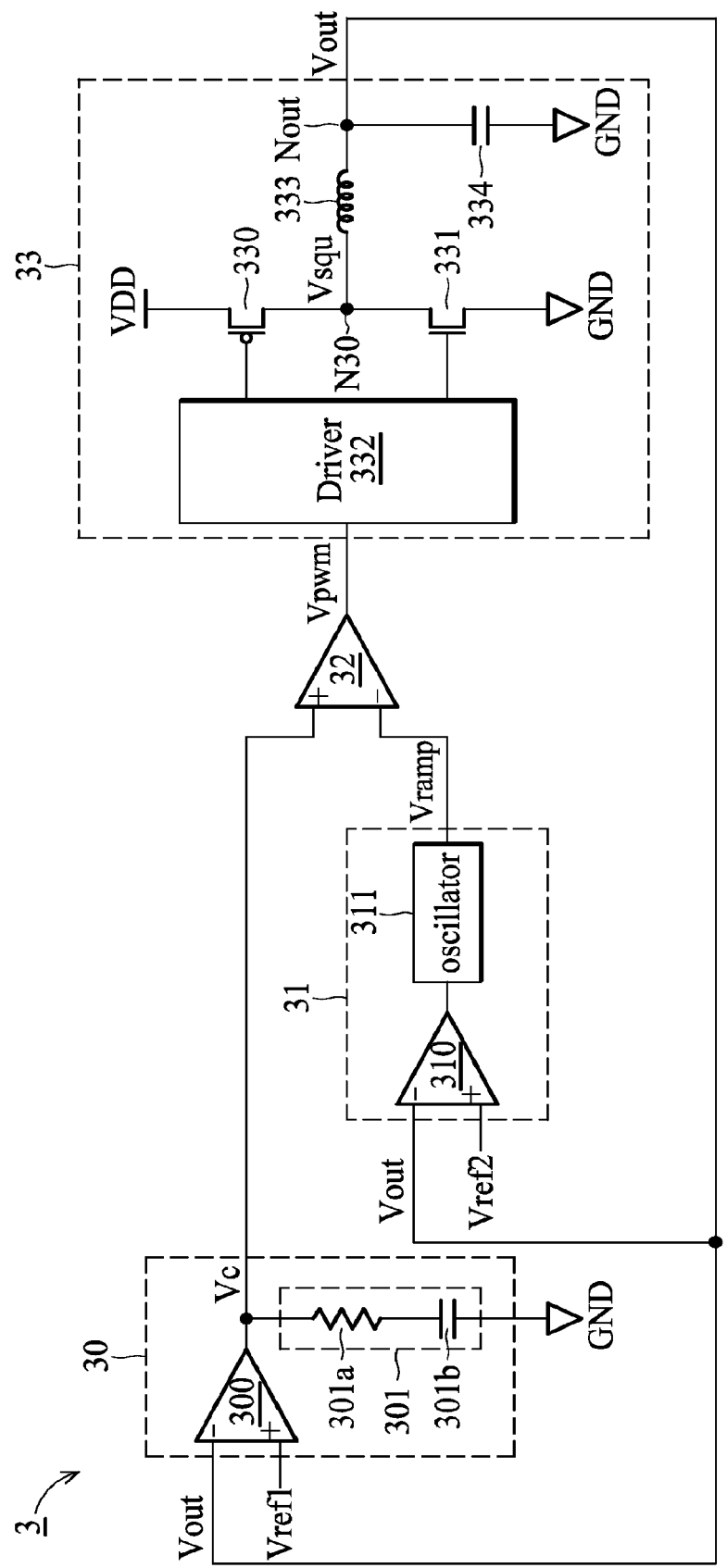
FIG. 3 shows an exemplary embodiment of a voltage converter of the invention.

Voltage converters are provided. In an exemplary embodiment of a voltage converter of the invention in FIG. 3, a voltage converter 3 generates a direct-current (DC) output voltage signal Vout and comprises a controller 30, a wave generator 31, a comparator 32, and a voltage converting unit 33. Referring to FIG. 3, the controller 30 receives the output voltage signal Vout and a reference voltage Vref1 and generates a control voltage signal Vc according to the output voltage signal Vout and the reference voltage Vref1. The wave generator 31 receives the output voltage signal Vout, generates a saw-wave signal Vramp, and modifies an upper limit of the saw-wave signal Vramp according to the output voltage signal Vout. The comparator 32 receives the control voltage signal Vc and the saw-wave signal Vramp and generates a pulse width modulation (PWM) signal Vpwm according to the difference between the control voltage signal Vc and the saw-wave signal Vramp. The voltage converting unit 33 is coupled to a supply voltage source VDD and a signal ground GND and generates the output voltage signal Vout according to the PWM signal Vpwm.

Referring to FIG. 3, the controller 30 comprises an error amplifier 300 and a compensating unit 301. The error amplifier 300 receives the output voltage signal Vout and the reference voltage Vref1 and generates the control voltage signal Vc according to the difference between the output voltage signal Vout and the reference voltage Vref1. The control voltage signal Vc is output to a positive input terminal of the comparator 32. The compensating unit 301 is charged or discharged by the control voltage signal Vc to stabilize the level of the control voltage signal Vc. In other words, the compensating unit 301 is arranged to compensate the control voltage signal Vc. In this embodiment, the compensating unit 301 comprises a resistor 301a and a capacitor 301b. For example, the capacitor 301b has a large capacitance, which is advantageous for stabilizing the level of the control voltage signal Vc. Thus, the control voltage signal Vc is allowed to be remained at a relatively constant level.

The wave generator 31 comprises a comparator 310 and an oscillator 311. The comparator 310 receives and compares the output voltage signal Vout and a reference voltage Vref2. The oscillator 311 generates the saw-wave signal Vramp and modifies the upper limit of the saw-wave signal Vramp according to the compared result of the comparator 310. The saw-wave signal Vramp is output to a negative input terminal of the comparator 32.

The voltage converting unit 33 comprises a P-type metal oxide semiconductor (PMOS) transistor 330, an N-type MOS (NMOS) transistor 331, a driver 332, an inductor 333, and a capacitor 334. The PMOS transistor has a gate, a source coupled to the supply voltage source VDD, and a drain coupled to a node N30. The NMOS transistor 331 has a gate, a source coupled to the signal ground GND, and a drain coupled to the node N30. The driver 332 receives the PWM signal Vpwm and respectively switches the PMOS and NMOS transistors 330 and 331 according to the PWM signal Vpwm. By switching the ON/OFF states of PMOS and NMOS transistors 330 and 331, a square signal Vsqu is generated at the node N30 according to voltage of the supply voltage source VDD and the signal ground GND. The inductor 333 is coupled between the node N30 and an output node Nout, and the capacitor 334 is coupled between the output node Nout and the signal ground GND. The inductor 333 and the capacitor 334 compose a low-pass filter, so that the square signal Vsqu is filtered by the low-pass filter, and the DC output voltage signal Vout is generated at the output node Nout.

Figure 4:
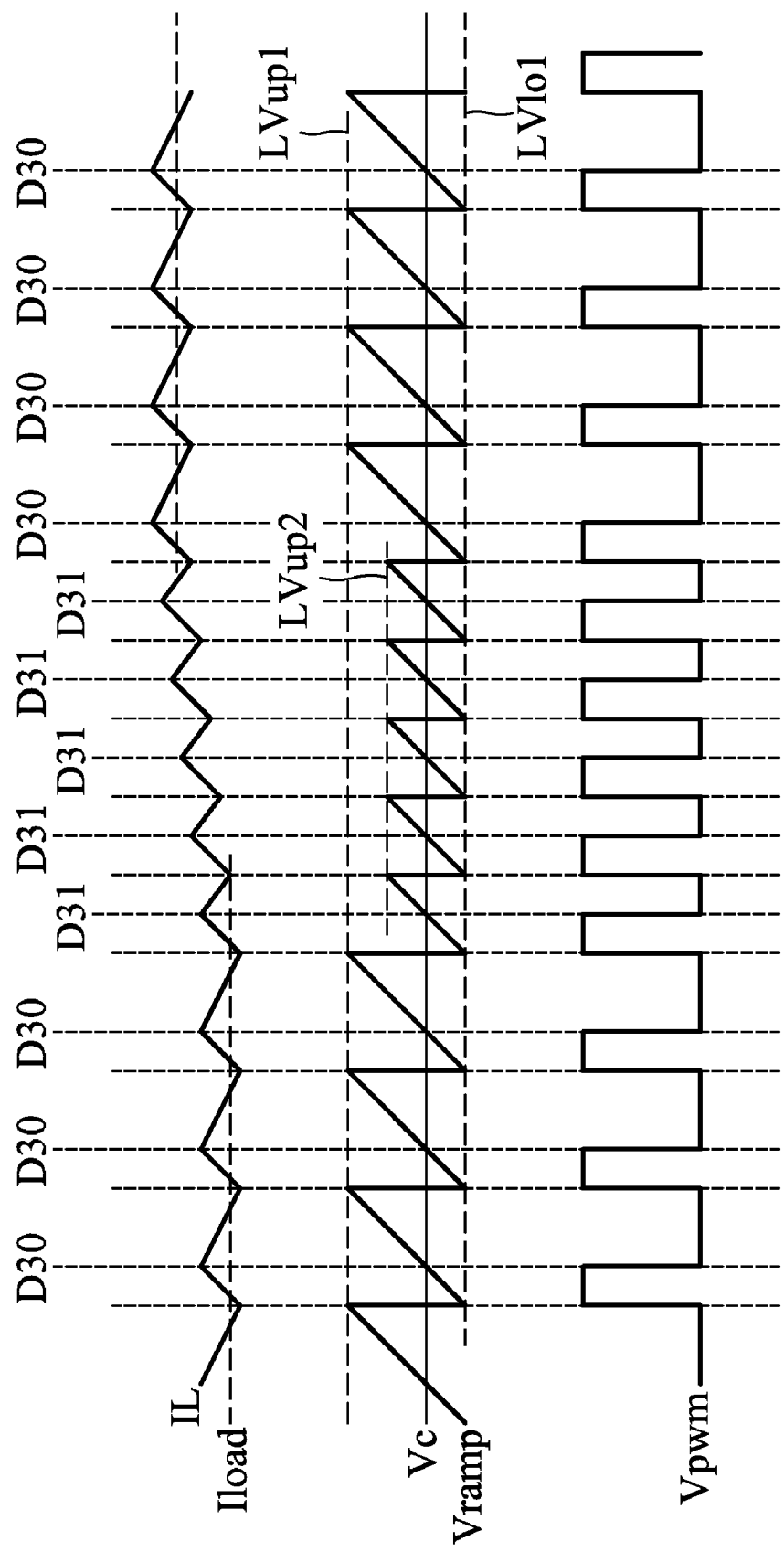
FIG. 4 shows an example of signal waveforms in the voltage converter of FIG. 3.

FIG. 4 shows waveforms of the signals in FIG. 3, wherein current signal Iload represents required current of an external load coupled to the voltage converter 3, and current signal IL represents current of the inductor 333. Following, the detailed operation of the wave generator 31 will be described with reference to FIGS. 3 and 4. In this embodiment, the reference voltage Vref2 is initially set to be lower than the level of the output voltage signal Vout. In the stable state, the level of the output voltage signal Vout keeps higher than the reference voltage Verf2, that is, does not exceed a boundary defined by the reference voltage Verf2. In the embodiment, due to the reference voltage Vref2 initially set to be lower than the level of the output voltage signal Vout, "exceeding the boundary" means that the level of the output voltage signal Vout exceeds downward the level of the reference voltage Vref2. On the contrary, if the reference voltage Vref2 is initially set to be higher than the level of the output voltage signal Vout, "exceeding the boundary" means that the level of the output voltage signal Vout exceeds upward the level of the reference voltage Vref2. Thus, the condition of exceeding the boundary is determined according to the initial levels of the reference voltage Vref2 and the output voltage signal Vout. Additionally, the oscillator 311 generates the saw-wave signal Vramp, wherein the upper limit of a waveform of the saw-wave signal Vramp is at a level LVup1 and the lower limit of the waveform of the saw-wave signal Vramp is at a level LVlo1. By comparing the control voltage signal Vc with the saw-wave signal Vramp having the upper limit LVup1, the comparator 32 generates the PWM signal Vpwm with a duty cycle D30. The driver 332 respectively switches the PMOS and NMOS transistors 330 and 331 according to the PWM signal Vpwm with the duty cycle D30, and then the DC output voltage signal Vout is generated at the output node Nout.

Referring to FIGS. 3 and 4, when an external load coupled to the voltage converter 3 draws out a large current from the output node Nout, e.g. the loading changes from light to heavy, the level of the output signal Vout is pulled down due to the large current. In this embodiment, due to the large capacitor 301b, the controller 30 is able to generate the control voltage signal Vc at a relatively constant level. Meanwhile, the comparator 310 detects a variation of the output voltage signal Vout by comparing the output voltage signal Vout with the reference voltage Vref2 which is initially set lower than the output voltage signal Vout. When the level of the output voltage signal Vout exceeds the reference voltage Vref2 since the large current is drawn out, in other words, the level of the output voltage signal Vout become lower than the boundary defined by the reference voltage Vref2, the oscillator 311 modifies the upper limit of the waveform of the saw-wave signal Vramp to level LVup2, which is lower than the level LVup1. Meanwhile, the lower limit of the waveform of the saw-wave signal Vramp can be fixed at the level LVlo1 in this embodiment. By comparing the control voltage signal Vc with the saw-wave signal Vramp having the upper limit LVup2, the comparator 32 generates the PWM signal Vpwm with a duty cycle D31, wherein the duty cycle D31 is greater than the duty cycle D30. The driver 332 respectively switches the PMOS and NMOS transistors 330 and 331 according to the PWM signal Vpwm with the duty cycle D31, and then the DC output voltage signal Vout is generated at the output node Nout. In this transient state, e.g. the duty cycle D31 greater than duty cycle D30 is advantageous for power transmission.

According to the embodiment in FIG. 4, when an external load coupled to the voltage converter 3 draws out a large current from the output node Nout, the duty cycle of the PWM signal Vpwm is increased according to the variation of the output voltage signal Vout for advantageous power transmission. Additionally, because the capacitor 301b is not required to be small, control voltage signal Vc stability is not sacrificed.

Figure 5:
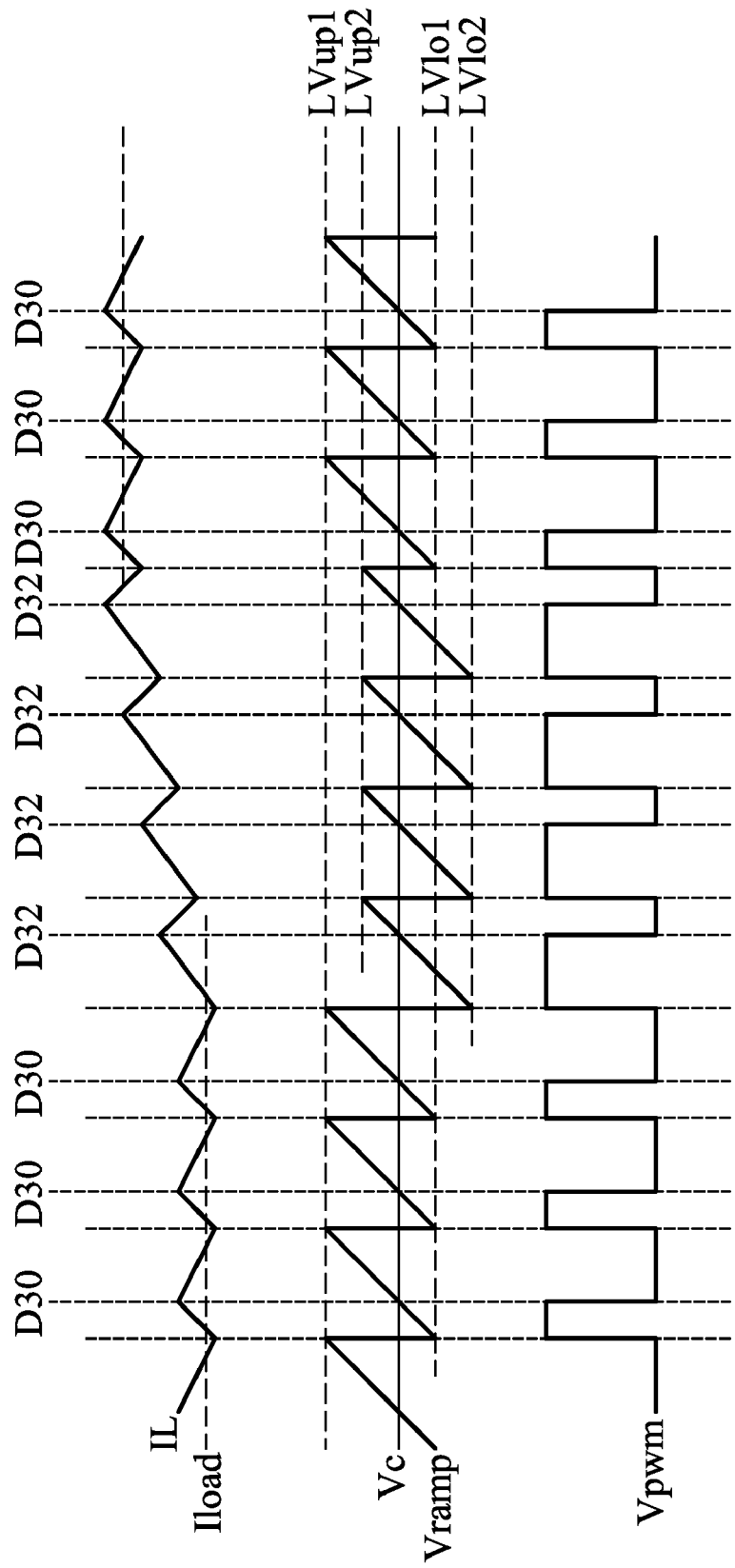
FIG. 5 shows another example of signal waveforms in the voltage converter of FIG. 3.

In another embodiment, referring to FIG. 5, when an external load coupled to the voltage converter 3 draws out a large current from the output node Nout, e.g. the loading changes from light to heavy, the oscillator 311 can also modify, in addition to the upper limit, the lower limit of the waveform of the saw-wave signal Vramp to a level LVlo2 for the transient state. It is noted that the difference between the levels LVup1 and LVlo1 can be approximately equal to the difference between the levels LVup2 and LVlo2 in this embodiment. In this transient state, since the time period for the high (non-zero) level of the PWM signal Vpwm is increased, the PWM signal Vpwm has a greater duty cycle D32 than the stable-state duty cycle D30.

Figure 6:
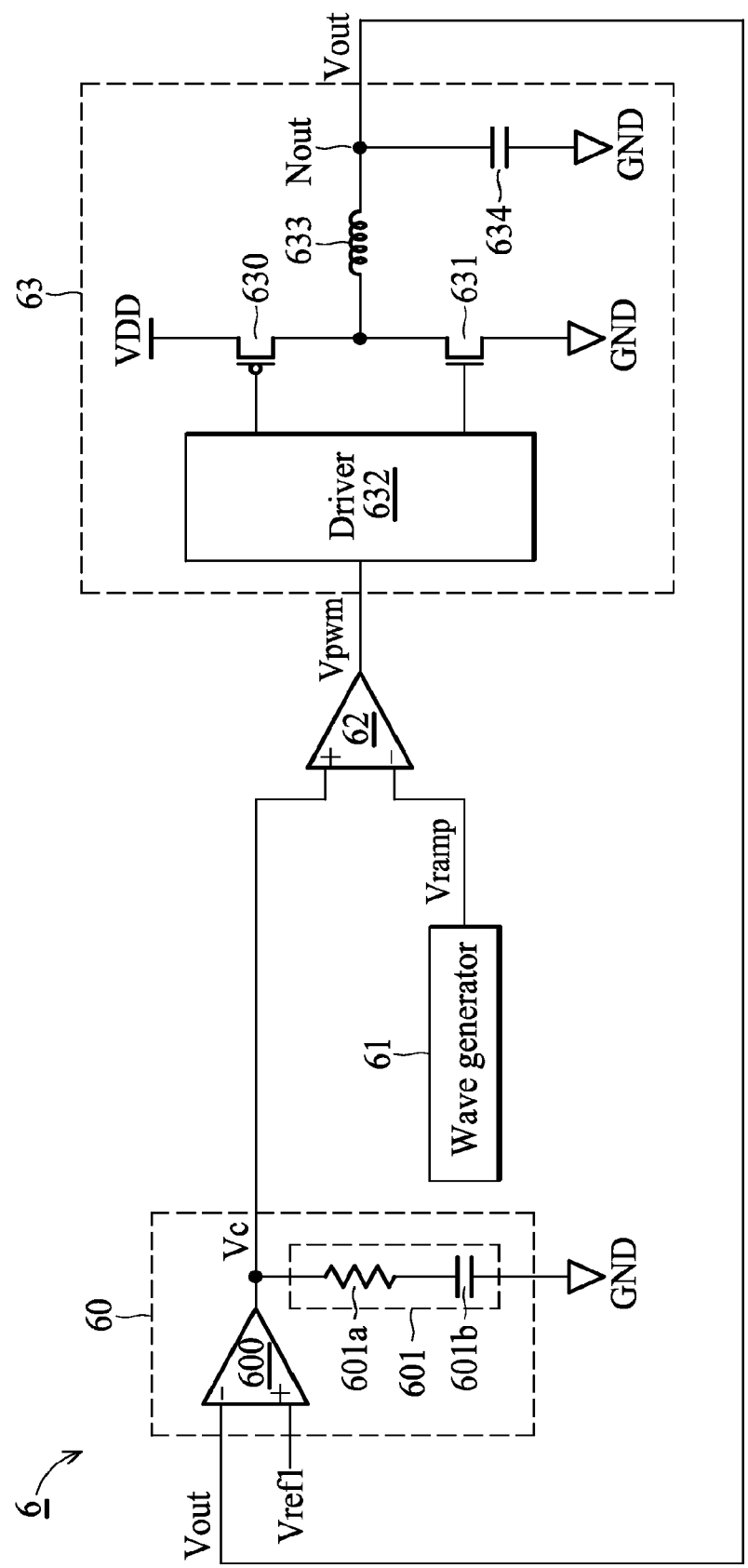
FIG. 6 shows another exemplary embodiment of a voltage converter of the invention.
Figure 7:
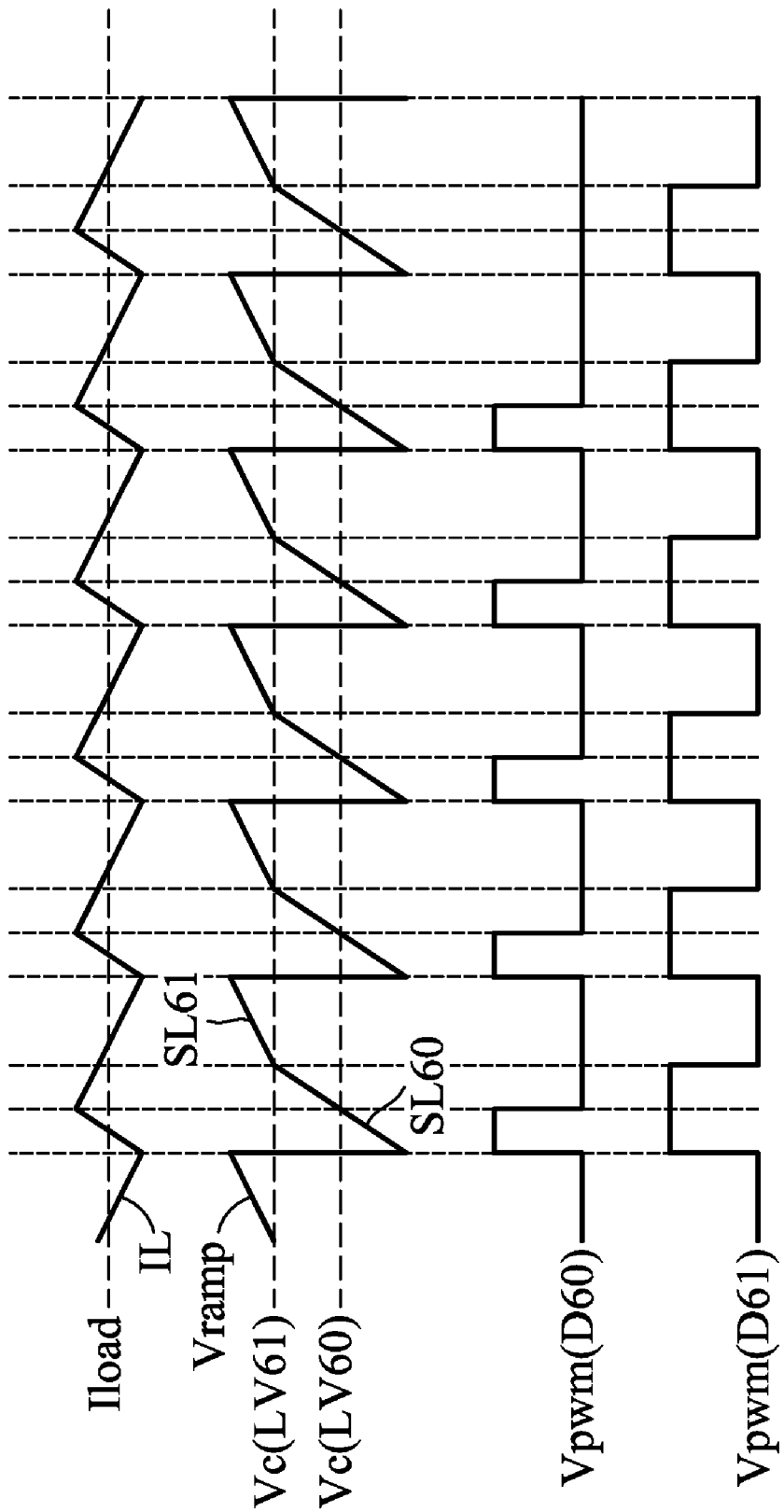
FIG. 7 is an example of signal waveforms in the voltage converter of FIG. 6.

FIG. 6 shows another exemplary embodiment of a voltage converter of the invention. Referring to FIG. 6, a voltage converter 6 generates a direct-current (DC) output voltage signal Vout and comprises a controller 60, a wave generator 61, a comparator 62, and a voltage converting unit 63. The controller 60 receives the output voltage signal Vout and a reference voltage Vref1 and generates a control voltage signal Vc according to the output voltage signal Vout and the reference voltage Vre1. The wave generator 61 generates a saw-wave signal Vramp of which a wave form has at least two different slopes within a period. As shown in FIG. 7, in the embodiment, a former section of the waveform of the saw-wave signal Vramp has a steep slope SL60, and a later section of the waveform of the saw-wave signal Vramp, following the former section, has a smooth slope SL61. The comparator 62 receives the control voltage signal Vc and the saw-wave signal Vramp and generates a PWM signal Vpwm according to the difference between the control voltage signal Vc and the saw-wave signal Vramp. The voltage converting unit 63 is coupled to a supply voltage source VDD and a signal ground GND and generates the output voltage signal Vout at an output node Nout according to the PWM signal Vpwm.

The controller 60 comprises an error amplifier 600 and a compensating unit 601. The compensating unit 601 comprises a resistor 601a and a capacitor 601b. The voltage converting unit 63 comprises a PMOS transistor 630, an NMOS transistor 631, a driver 632, an inductor 633, and a capacitor 634, and performs the same operations as the voltage converting unit 33 in FIG. 3. The comparator 62 performs the same operations as the comparator 32 in the FIG. 3. Thus, the detailed circuitry and operations of the controller 60, the comparator 62, and the voltage converting unit 63 are omitted for clarity. The wave generator 61 directly generates the saw-wave signal Vramp of which the waveform has at least two different slopes. In the embodiment, the former section and the later section of the waveform of the saw-wave signal Vramp respectively have a steep slope SL60 and a smooth slope SL61.

Referring to FIG. 7, in a stable state, the control voltage signal Vc is at a level LV60, and the PWM signal Vpwm has a duty cycle D60. When an external load coupled to the voltage converter 6 draws out a large current from the output node Nout, the level of the output signal Vout is pulled down due to the large current. The controller 60 generates the control voltage signal Vc with a higher level LV61 by comparing the difference between the output voltage signal Vout having the lowered level with the reference voltage Vref1. Then, the comparator 62 generates the PWM signal Vpwm with a duty cycle D61 according to the control voltage signal Vc with the level LV61 and the saw-wave signal Vramp. Referring to FIG. 7, since the level LV61 is higher than the level LV60, the duty cycle D60 of the saw-wave signal Vramp is greater than the duty cycle D60 by comparing the control signal Vc and the saw-wave signal Vramp. In this embodiment, due to the steeper slope SL60, when an external load coupled to the voltage converter 6 draws out a large current, the duty cycle of the saw-wave signal Vramp becomes greater as the control signal Vc is slightly shifted from the level LV60 to the higher level LV61.

According to the embodiment in FIG. 7, when an external load coupled to the voltage converter 6 draws out a large current from the output node Nout, the duty cycle of the PWM signal Vpwm is increased according to the saw-wave signal Vramp with the waveform having at least two different slopes for advantageous power transmission. Additionally, because the capacitor 601b is not required to be small, control voltage signal Vc stability is not sacrificed.

As described above, the embodiments provide a voltage converter for generating an output voltage signal, which comprises a controller, a wave generator, a comparator, and a voltage converting unit. The controller generates a control voltage signal according to the output voltage signal and a first reference voltage. The wave generator generates a saw-wave signal. The comparator generates a pulse width modulation (PWM) signal according to the control voltage signal and the saw-wave signal. The voltage converting unit generates the output voltage signal according to the PWM signal. When loading of the voltage converter is greater, a duty cycle of the PWM signal is accordingly increased. For example, the increase in the duty of the PWM signal is achieved by the saw-wave signal Vramp with variable frequency or with two different slopes. In the embodiment of FIGS. 3 and 4, in the stable state, the saw-wave signal Vramp is of less frequency and the PWM signal Vpwm has a less duty cycle D30; when an external load coupled to the voltage converter 3 draws out a large current from the output node Nout, e.g. the loading changes from light to heavy, the saw-wave signal Vramp becomes of a greater frequency and the PWM signal Vpwm has an increased duty cycle D31.

In the other embodiment of FIGS. 6 and 7, the saw-wave Vramp has two different slopes. In the stable state, the control voltage signal Vc is at a lower level LV60, and the PWM signal Vpwm has a less duty cycle D60 by comparing the control voltage signal Vc and the portion of the saw-wave Vramp with the steeper slop SL60. When an external load coupled to the voltage converter 6 draws out a large current from the output node Nout, the control voltage signal Vc is at a higher level LV61, and the PWM signal Vpwm thus has an increased duty cycle D61 by comparing the control voltage signal Vc and the portion of the saw-wave Vramp with the smoother slop SL61.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage converter for generating an output voltage signal, comprising:
    a controller for generating a control voltage signal according to the output voltage signal and a first reference voltage;
    a wave generator for generating a saw-wave signal and modifying at least one of an upper limit and a lower limit of a waveform of the saw-wave signal according to the output voltage signal;
    a first comparator for generating a pulse width modulation (PWM) signal according to the control voltage signal and the saw-wave signal; and
    a voltage converting unit for generating the output voltage signal according to the PWM signal;
    wherein the wave generator comprises:
        a second comparator for comparing the output voltage signal with a second reference voltage; and
        an oscillator for generating the saw-wave signal and changing the least one of the upper limit and the lower limit of the waveform of the saw-wave signal according to a compared result of the second comparator.

2. The voltage converter as claimed in claim 1, wherein the oscillator generates the saw-wave signal with the upper limit of the waveform at a first level when a level of the output voltage signal does not exceed the second reference voltage and generates the saw-wave signal with the upper limit of the waveform at a second level when the level of the output voltage signal exceeds the second reference voltage, and the second level is lower than the first level.

3. The voltage converter as claimed in claim 2, wherein the oscillator generates the saw-wave signal with a lower level of the waveform at a third level when the level of the output voltage signal does not exceed the second reference voltage and generates the saw-wave signal with the lower limit of the waveform at a fourth level when the level of the output voltage signal exceeds the second reference voltage, and the fourth level is lower than the third level.

4. The voltage converter as claimed in claim 1, wherein the oscillator generates the saw-wave signal with the lower limit of the waveform at a first level when a level of the output voltage signal does not exceed the second reference voltage and generates the saw-wave signal with the lower limit of the waveform at a second level when the level of the output voltage signal exceeds the second reference voltage, and the second level is lower than the first level.

5. The voltage converter as claimed in claim 1, wherein the controller comprises:
    an error amplifier for generating the control voltage signal according to a difference between the output voltage signal and the first reference voltage; and
    a compensating unit for compensating the control voltage signal.

6. The voltage converter as claimed in claim 1, wherein the voltage converting unit comprises:
    a P-type metal oxide semiconductor (PMOS) transistor having a gate, a source coupled to a supply voltage source, and a drain coupled to a first node; herein the output voltage signal is outputted from the output node; and
    a capacitor coupled between the output node and the signal ground.

7. The voltage converter as claimed in claim 1, wherein the wave generator is arranged to modify one of the upper limit and the lower limit of the waveform of the saw-wave signal, and maintain the other of the upper limit and the lower limit of the waveform of the saw-wave signal.

8. The voltage converter as claimed in claim 1, wherein the difference between the upper limit and the lower limit of the waveform of the saw-wave signal is approximately fixed.

9. A voltage converter for generating an output voltage signal, comprising:
    a controller for generating a control voltage signal according to the output voltage signal and a first reference voltage;
    a wave generator for generating a saw-wave signal, wherein a waveform of the saw-wave signal has at least two different slopes in a leading edge of each pulse of the saw-wave signal;
    a comparator for generating a pulse width modulation (PWM) signal according to the control voltage signal and the saw-wave signal; and
    a voltage converting unit for generating the output voltage signal according to the PWM signal.

10. The voltage converter as claimed in claim 9, wherein the waveform of the leading edge has a former section and a later section, and a slope of the former section is steeper than a slope of the later section.

11. The voltage converter as claimed in claim 9, wherein the controller comprises:
    an error amplifier for generating the control voltage signal according to a difference between the output voltage signal and the first reference voltage; and
    a compensating unit for compensating the control voltage signal.

12. The voltage converter as claimed in claim 9, wherein the voltage converting unit comprises:
    a P-type metal oxide semiconductor (PMOS) transistor having a gate, a source coupled to a supply voltage source, and a drain coupled to a first node;
    an N-type MOS (NMOS) transistor having a gate, a source coupled to a signal ground, and a drain coupled to the first node;
    a driver for receiving the PWM signal and respectively switching the PMOS and NMOS transistors according to the PWM signal;
    an inductor coupled between the first node and an output node, wherein the output voltage signal is outputted from the output node; and
    a capacitor coupled between the output node and the signal ground.

13. A voltage generating method for generating an output voltage signal, comprising:

providing a saw-wave signal with a waveform having at least two different slopes in a leading edge of each pulse of the saw-wave signal;

comparing a control voltage signal with the saw-wave signal to generate a compared result;

generating a pulse width modulation (PWM) signal according to the compared result; and generating the output voltage signal according to the PWM signal.

14. The voltage generating method as claimed in claim 13, wherein the step of providing the saw-wave signal with a waveform having the at least two different slopes comprises:

setting a former section of the waveform of the leading edge at a steep slope; and setting a later section of the waveform of the leading edge at a smooth slope, wherein the later section follows the former section.

\* \* \* \* \*